United States Patent
Tsau

(10) Patent No.: US 9,635,788 B2
(45) Date of Patent: Apr. 25, 2017

(54) SHIELDING DEVICE

(71) Applicant: EZCONN CORPORATION, Taipei (TW)

(72) Inventor: Chang-Jie Tsau, Taipei (TW)

(73) Assignee: EZCONN CORPORATION, Taipei (TW)

( * ) Notice: Subject to any disclaimer, the term of this patent is extended or adjusted under 35 U.S.C. 154(b) by 0 days.

(21) Appl. No.: 13/861,351

(22) Filed: Apr. 11, 2013

(65) Prior Publication Data

US 2013/0313014 A1    Nov. 28, 2013

Related U.S. Application Data

(63) Continuation-in-part of application No. 12/962,831, filed on Dec. 8, 2010.

(51) Int. Cl.
*H05K 9/00* (2006.01)
*H01R 13/6581* (2011.01)

(52) U.S. Cl.
CPC ....... *H05K 9/0018* (2013.01); *H01R 13/6581* (2013.01); *H05K 9/006* (2013.01); *H05K 9/0032* (2013.01)

(58) Field of Classification Search
CPC .... H05K 9/0018; H05K 9/006; H05K 9/0032; H01R 13/6581
USPC ................... 439/545, 566; 174/359
See application file for complete search history.

(56) References Cited

U.S. PATENT DOCUMENTS

| | | | | | |
|---|---|---|---|---|---|
| 4,761,712 | A  * | 8/1988 | Ito et al. | ......................... | 361/829 |
| 6,210,216 | B1 * | 4/2001 | Tso-Chin et al. | ............. | 439/545 |
| 6,899,545 | B2 * | 5/2005 | Pollock et al. | ................. | 439/63 |
| 7,442,881 | B1 * | 10/2008 | Chien | ........................... | 174/382 |
| 7,466,564 | B2 * | 12/2008 | Harada et al. | ................ | 361/814 |
| 7,952,891 | B2 * | 5/2011 | Tsau | .............. | 361/818 |
| 2003/0094299 | A1 * | 5/2003 | Lee | ...................... | H05K 9/0018 174/59 |
| 2008/0007929 | A1 * | 1/2008 | Blashewski et al. | ......... | 361/796 |
| 2012/0024589 | A1 * | 2/2012 | Shian | ............................ | 174/382 |
| 2014/0141634 | A1 * | 5/2014 | Sasano | ................. | H01R 13/652 439/108 |

* cited by examiner

*Primary Examiner* — Hung V Ngo
(74) *Attorney, Agent, or Firm* — Min-Lee Teng; Litron Patent & Trademark Office

(57) ABSTRACT

A shielding device configured to be fixed with a circuit board, comprises a frame body comprising multiple sideboards standing at multiple sides of said frame body, wherein a receiving hole and a slot around said receiving hole is at one of said sideboards; and a connector fixed with said frame body, wherein said connector comprises a protrusion at an end of said connector, wherein said protrusion pass through said slot and a top of said protrusion fixed with said slot, wherein said receiving hole receives a portion of said connector. The invention meets the requirement for high torque specification without any additional reinforcing measure.

20 Claims, 11 Drawing Sheets

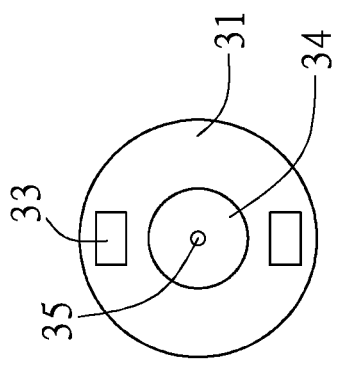
FIG. 5E
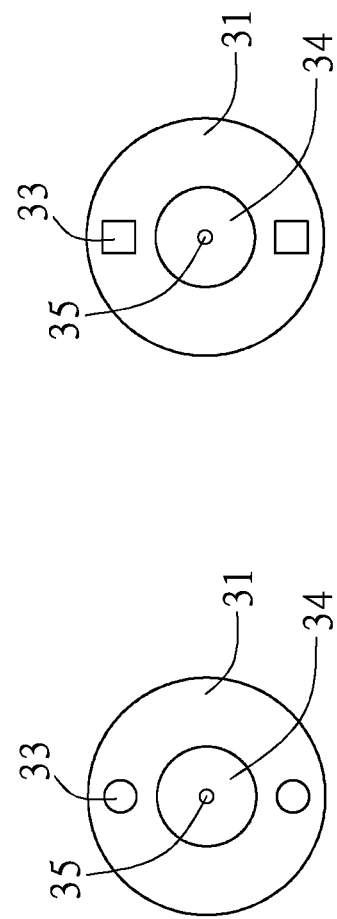
FIG. 5D
FIG. 5C
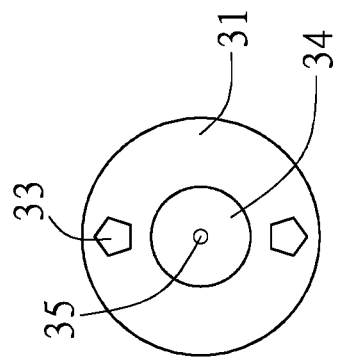
FIG. 5F

SHIELDING DEVICE

RELATED APPLICATION

This application is a continuation-in-part of application Ser. No. 12/962,831, filed Dec. 8, 2010, all of which are incorporated herein by reference in their entirety.

BACKGROUND OF THE DISCLOSURE

Field of the Disclosure

The present invention relates generally to a shielding device, and more particularly to a shielding device with high torque.

Brief Description of the Related Art

FIGS. 1A and 1B show a conventional shielding device 10, which is affixed to a circuit board by means of soldering. The shielding device 10 includes a frame body 11 connected with a connector 12 for signal input/output. The frame body 11 is formed with a connection hole 13 for receiving therein an end protrusion 14 of the connector 12. After the end protrusion 14 is fitted into the connection hole 13, the end protrusion 14 is riveted to connect the connector 12 with the frame body 11. The frame body 11 and the connector 12 are simply connected by means of riveting so that the shielding device 10 can only have a torque value up to 30.about.40 kg-cm. This only meets the requirement for low torque specification, while failing to meet the high torque specification regulated by Society of Cable Television Engineers (SCTE), which is over 41 kg-cm.

To overcome the above problem, the junction between the frame body 11 and the connector 12 can be manually welded to increase the torque of the conventional shielding device.

SUMMARY OF THE DISCLOSURE

A primary object of the present invention is to provide a shielding device with high torque.

To achieve the above and other objects, shielding device of the present invention includes a frame body and a connector. The frame body is composed of multiple sideboards. One of the sideboards is formed with a receiving hole and at least one slot formed around the receiving hole. The connector has a main body section, a connection end section and at least one protrusion. The protrusion is formed on an end face of the main body section at a front end of the connector corresponding to the slot. The protrusion is installed into the slot of the frame body and then riveted to securely connect the connector with the frame body. The protrusions of the connector are assembled in the slot of the frame body to securely connect the connector with the frame body, whereby the shielding device can have a torque value over 60 kg-cm. The shielding device of the present invention meets the requirement for high torque specification.

These, as well as other components, steps, features, benefits, and advantages of the present disclosure, will now become clear from a review of the following detailed description of illustrative embodiments, the accompanying drawings, and the claims.

BRIEF DESCRIPTION OF THE DRAWINGS

The drawings disclose illustrative embodiments of the present disclosure. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIGS. 5B-5F are plane views showing connectors have peripheral protrusions with various shapes in accordance with a fourth embodiment of the present invention;

Figure 1B:
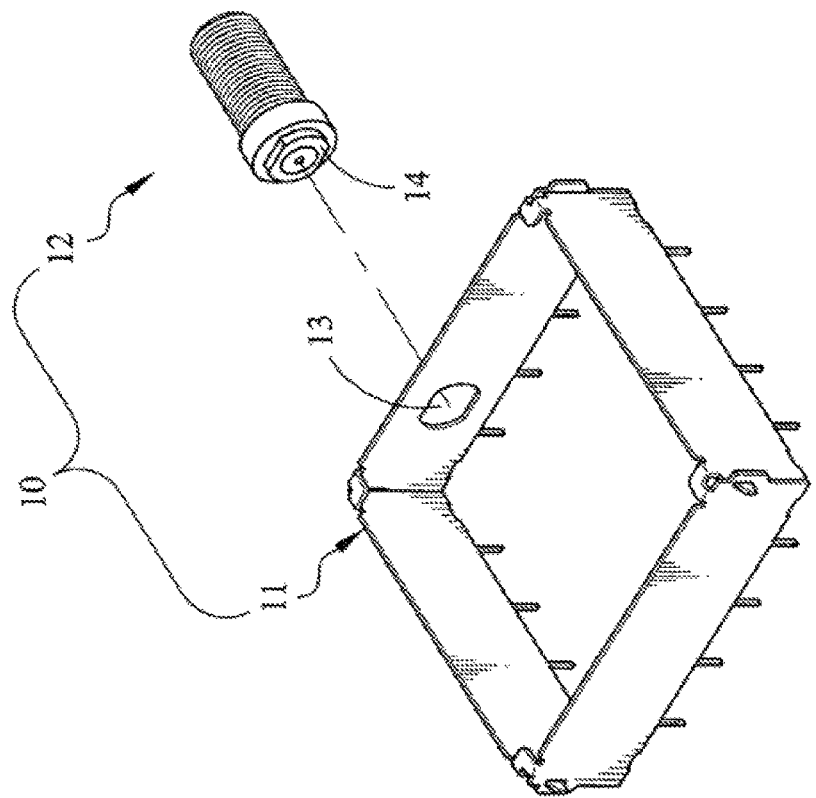
FIGS. 1A and 1B show a conventional shielding device 10, which is affixed to a circuit board by means of soldering.
Figure 1A:
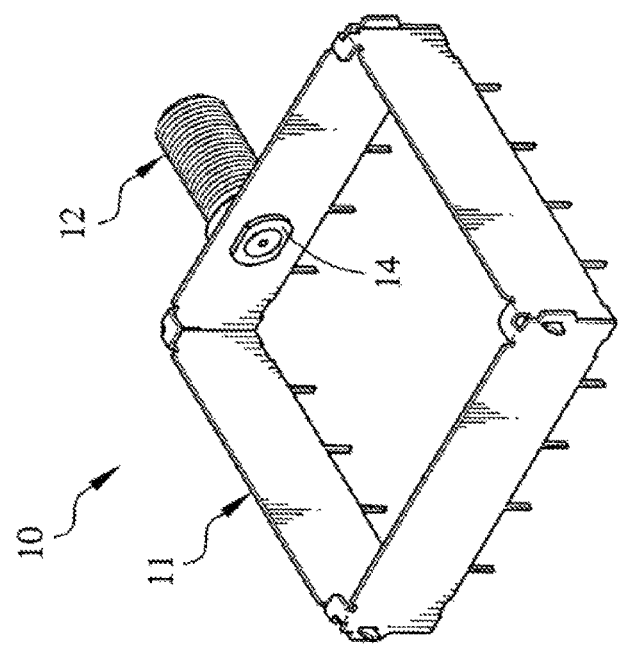

While certain embodiments are depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION OF THE INVENTION

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Figure 2A:
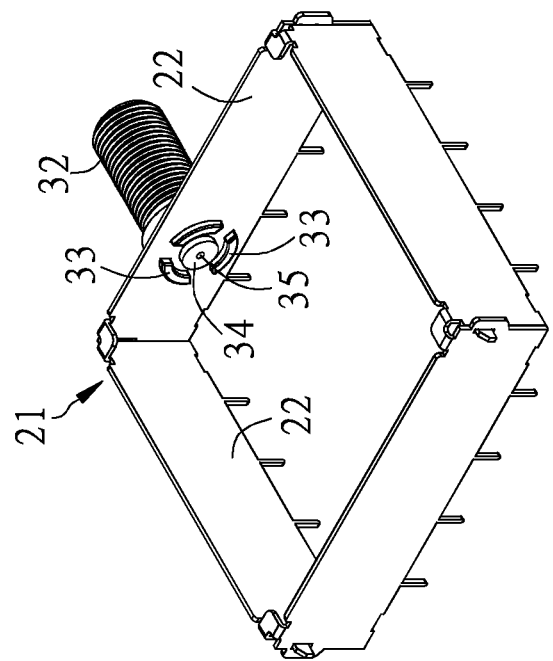
FIG. 2A is a perspective exploded view showing a connector and a frame body before assembled in accordance with a first embodiment of the present invention.
Figure 2B:
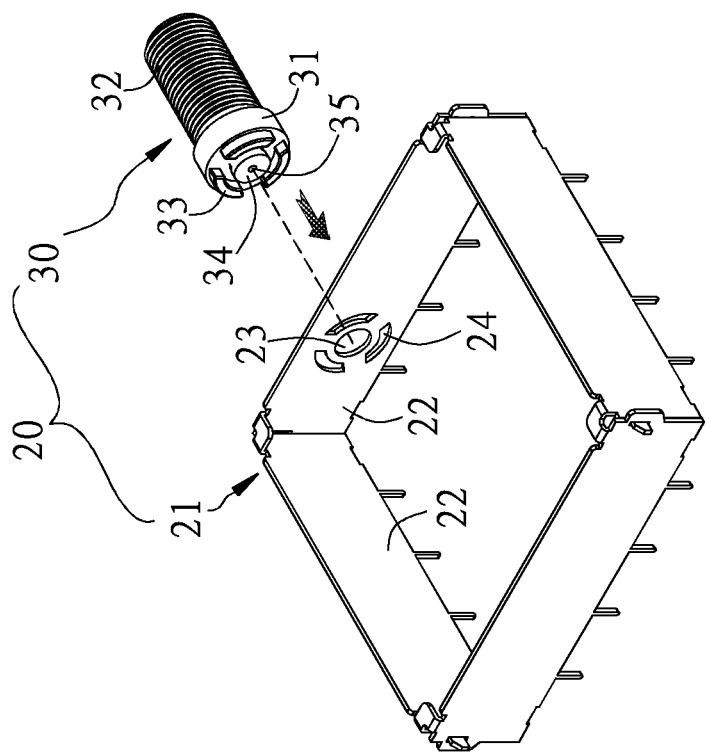
FIG. 2B is a perspective view showing a connector and a frame body after assembled in accordance with a first embodiment of the present invention.
Figure 2D:
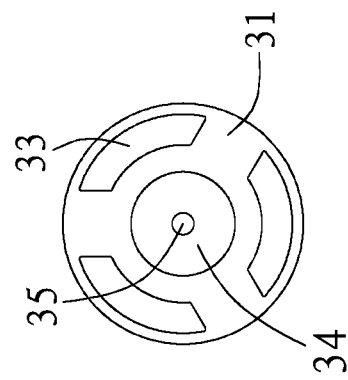
FIG. 2D is a plane view showing a connector in accordance with a first embodiment of the present invention.
Figure 2C:
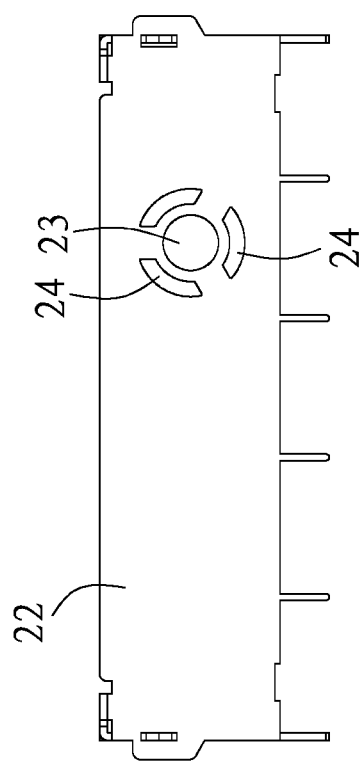
FIG. 2C is a plane view showing a sideboard in accordance with a first embodiment of the present invention.

Please refer to FIGS. 2A-2D. FIG. 2A is a perspective exploded view showing a connector and a frame body before assembled in accordance with a first embodiment of the present invention. FIG. 2B is a perspective view showing a connector and a frame body after assembled in accordance with a first embodiment of the present invention. FIG. 2C is a plane view showing a sideboard in accordance with a first embodiment of the present invention. FIG. 2D is a plane view showing a connector in accordance with a first embodiment of the present invention. The shielding device 20 of the present invention includes a frame body 21 mountable on a circuit board. The frame body 21 is connected to a connector 30 for signal input/output.

The configuration of the frame body 21 can be designed according to the requirement of the manufacturer. In this embodiment, the frame body 21 has the form of a rectangular solid. The frame body 21 is composed of four sideboards 22. One of the four sideboards 22 is formed with a receiving hole 23 having a circular shape and three arcuate slots 24. As shown in FIGS. 2A-2C, the three slots 24 are formed around the receiving hole 23 at equal intervals.

Figure 2G:
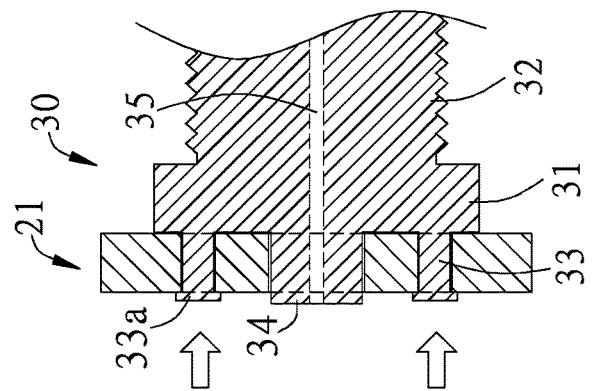
FIGS. 2E-2G are cross-sectional views of a riveting process of the peripheral protrusions being riveted to the slots in accordance with the present invention.
Figure 2F:
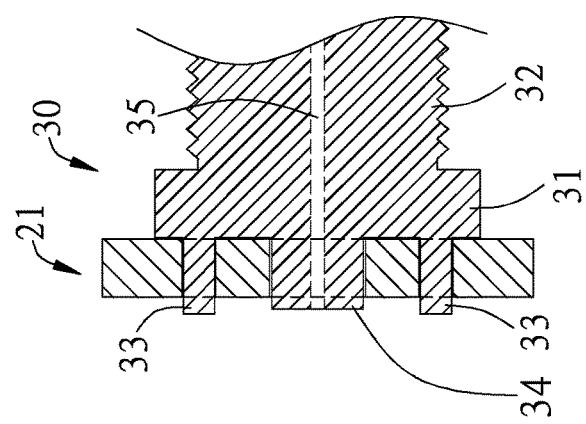
Figure 2E:
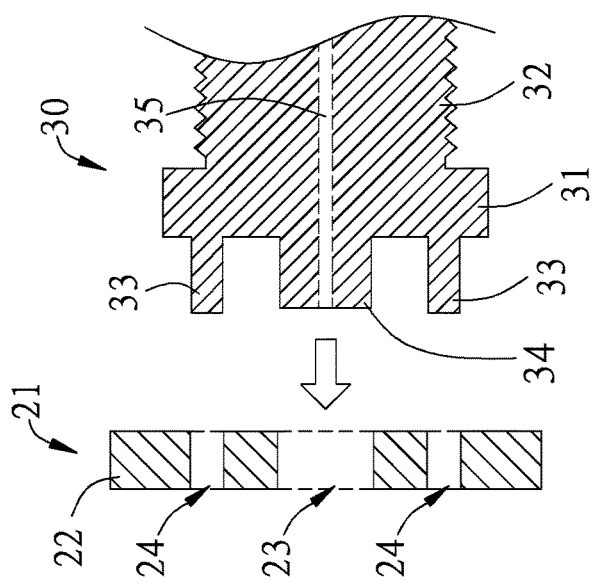

The connector 30 has a main body section 31, a connection end section 32, a central protrusion 34 having a circular shape with a center at a longitudinal axis of the connector 30 and multiple peripheral protrusions 33 surrounding the central protrusion 34, wherein the central protrusion 34 and peripheral protrusions 33 are integral with the connector 30. The connector 30 is shaped like a round cylinder with a thread at an outer surface of the connection end section 32 of the round cylinder. A hole 35 passing through the central protrusion 34 and extending along the longitudinal axis of the connector 30 for receiving one or more wire transferring radio-frequency (RF) signals, optical signals, or digital signals, wherein the wire can be a metal wire, a fiber wire, a copper wire, a silver wire or a copper wire covered with nickel plating. Referring to FIGS. 2A-2D, in this embodiment, there are three arcuate peripheral protrusions 33 formed on an end face of the main body section 31 at a front end of the connector 30 corresponding to the arcuate slots 24. The peripheral protrusions 33 can be installed into the arcuate slots 24 of the frame body 21 and then riveted to securely connect the connector 30 with the frame body 21 as shown in FIG. 2B. FIGS. 2E-2G are cross-sectional views of a riveting process of the peripheral protrusions 33 being riveted to the slots 24 in accordance with the present invention. Referring to FIGS. 2E-2G, after the central protrusion 34 and peripheral protrusions 33 are inserted into the receiving hole 23 and the slots 24 respectively, the peripheral protrusions 33 can be pressed to be deformed with flat portions 33a at tops of the peripheral protrusions 33, wherein each of the flat portions has a lateral or transverse dimension greater than a lateral dimension of a corresponding one of the slots 24 and greater than a lateral or transverse dimension of a center portion of the corresponding peripheral protrusion 33, so as to fix with the slots 24 in the sideboard 22 as seen in FIG. 2G. The connector 30 covers the receiving hole 23 and the slots 24. Thereby, the connector 30 can be riveted to the frame body 21. Optionally, after the peripheral protrusions 33 are riveted to the slots 24, a soldering process can be applied to the outer edges of the flat portions 33a so as to form solder joints each joining one of the outer edges of the flat portions 33a and the sideboard 22. Alternatively, the process of deforming the peripheral protrusions 33 can be saved. That is, after the central protrusion 34 and peripheral protrusions 33 are inserted into the receiving hole 23 and the slots 24 respectively, a soldering process can be applied to outer edges of top portions of the peripheral protrusions 33 so as to form solder joints each joining the sideboard 22 and the outer edge of the top portion of one of the peripheral protrusions 33.

Figure 2J:
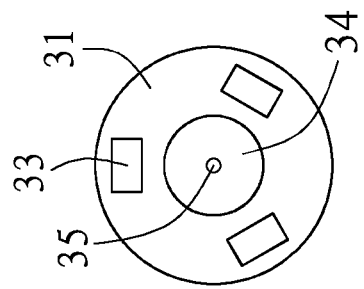
FIGS. 2H-2K are plane views showing peripheral protrusions of the connectors have various shapes in accordance with the first embodiment of the present invention.
Figure 2I:
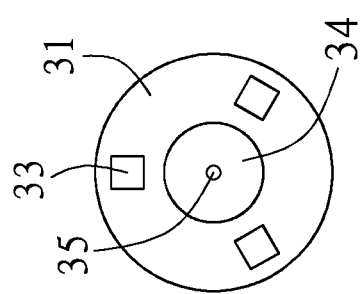
Figure 2H:
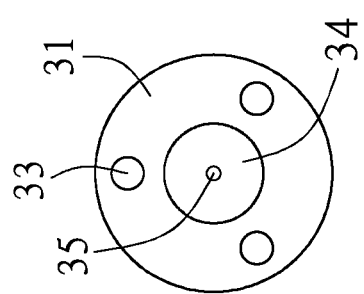
Figure 2K:
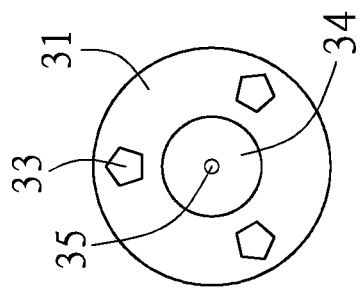

The slots 24 and the peripheral protrusions 33 may have a corresponding shape or the same shape. For example, referring to FIGS. 2C and 2D, the three slots 24 and three peripheral protrusions 33 have an arcuate shape. Alternatively, the three peripheral protrusions 33 may have a circular shape, as seen in FIG. 2H, and the three slots 24 can be replaced with three circular holes for receiving the three circular peripheral protrusions 33 such that the three circular peripheral protrusions 33 can be riveted and/or soldered to the three circular holes, as mentioned above. Alternatively, the three peripheral protrusions 33 may have a square shape, as seen in FIG. 2I, and the three slots 24 can be replaced with three square holes for receiving the three square peripheral protrusions 33 respectively such that the three square peripheral protrusions 33 can be riveted and/or soldered to the three square holes, as mentioned above. Alternatively, the three peripheral protrusions 33 may have a rectangular shape, as seen in FIG. 2J, and the three slots 24 can be replaced with three rectangular holes for receiving the three rectangular peripheral protrusions 33 respectively such that the three rectangular peripheral protrusions 33 can be riveted and/or soldered to the three rectangular holes, as mentioned above. Alternatively, the three peripheral protrusions 33 may have a polygon shape, such as pentagon shape, as seen in FIG. 2K, and the three slots 24 can be replaced with three polygon holes, such as pentagon holes, for receiving the three polygon peripheral protrusions 33 respectively such that the three polygon peripheral protrusions 33 can be riveted and/or soldered to the three polygon holes, as mentioned above. Alternatively, some of the peripheral protrusions 33 may have a shape different from the other some of the peripheral protrusions 33, and some of the slots or holes 24 may have a shape different from the other some of the slots or holes 24. For example, one of the three peripheral protrusions 33 may have an arcuate shape, and the other two of the three peripheral protrusions 33 may have a circular shape. In correspondence with the peripheral protrusions 33, one of the three slots or holes 24 may have an arcuate shape for receiving the arcuate one of the peripheral protrusions 33 and the other two of the three slots or holes 24 may have a circular shape for receiving the circular two of the peripheral protrusions 33 respectively. With respect to the above protrusions and slots or holes in the first embodiment, the slots or holes 24 are arranged at a first circular ring having the same center as that of the receiving hole 23 and the peripheral protrusions 33 are arranged at a second circular ring having the same center as that of the central protrusion 34, wherein the first circular ring has the same diameter as the second circular ring. A first distance in a radial direction is between each of the slots or holes 24 and the receiving hole 23 and the first distances between the slots or holes 24 and the receiving hole 23 can be substantially the same. A second distance in an arcuate direction along the first circular ring is between each neighboring two of the slots or holes 24 and the second distances between the neighboring two of the slots or holes 24 can be substantially the same. A first gap in a radial direction is between each of the peripheral protrusions 33 and the central protrusion 34 and the first gaps between the peripheral protrusions 33 and the central protrusion 34 can be substantially the same. A second gap in an arcuate direction along the second circular ring is between each neighboring two of the peripheral protrusions 33 and the second gaps between the neighboring two of the peripheral protrusions 33 can be substantially the same. The present invention is characterized in that the three peripheral protrusions 33 of the connector 30 are assembled in the three slots or holes 24 in the frame body 21 to securely connect the connector 30 with the frame body 21. The shielding device 20 of the present invention can have a torque value over 60 kg-cm. The shielding device 20 of the present invention meets the requirement for high torque specification.

Figure 3B:
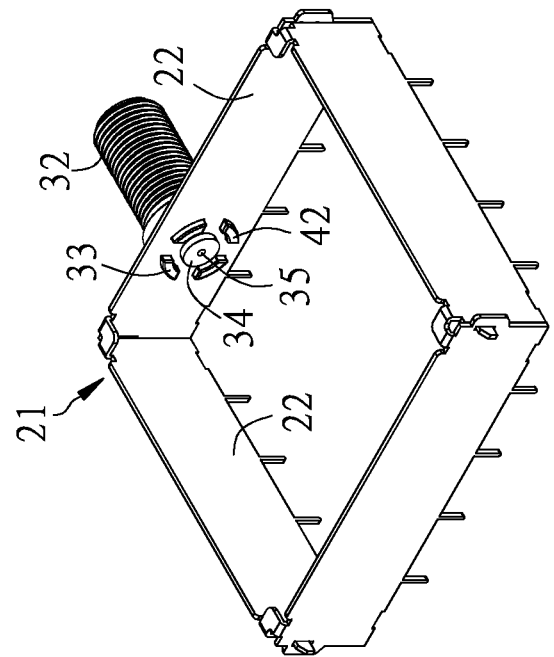
FIG. 3B is a perspective view showing a connector and a frame body after assembled in accordance with a second embodiment of the present invention.
Figure 3A:
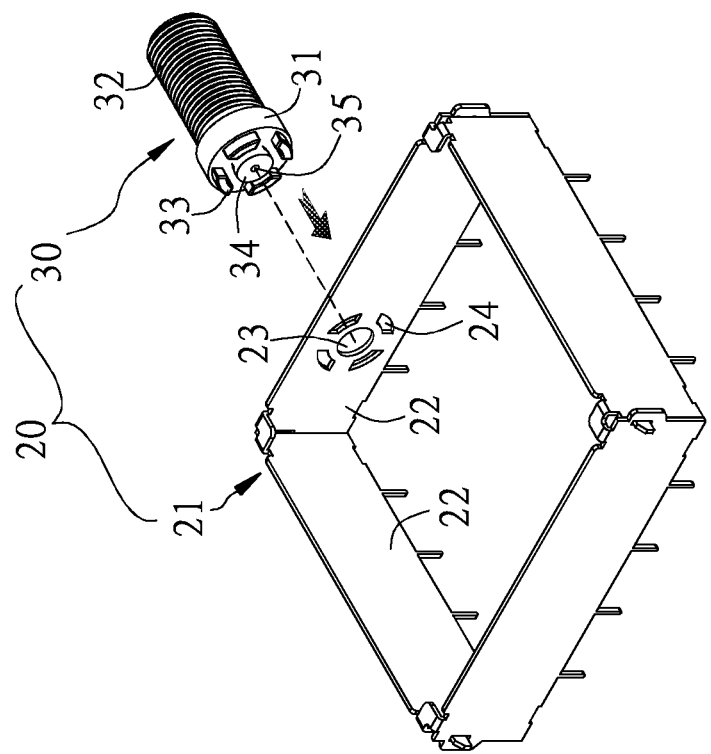
FIG. 3A is a perspective exploded view showing a connector and a frame body before assembled in accordance with a second embodiment of the present invention.
Figure 3D:
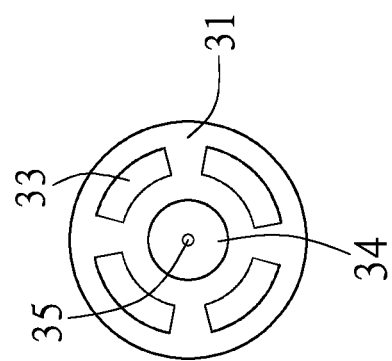
FIG. 3D is a plane view showing a connector in accordance with a second embodiment of the present invention.
Figure 3C:
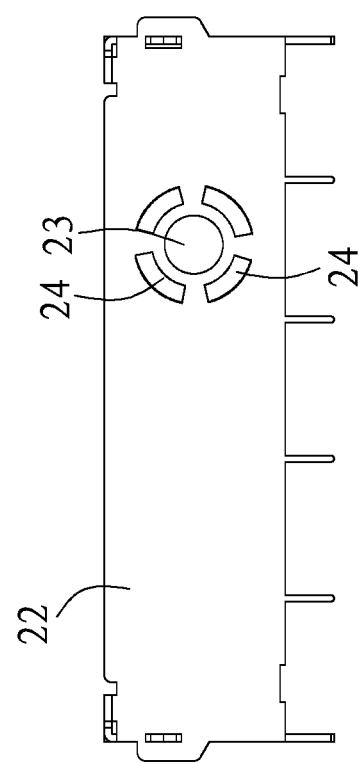
FIG. 3C is a plane view showing a sideboard in accordance with a second embodiment of the present invention.

FIG. 3A is a perspective exploded view showing a connector and a frame body before assembled in accordance with a second embodiment of the present invention, FIG. 3B is a perspective view showing a connector and a frame body after assembled in accordance with a second embodiment of the present invention, FIG. 3C is a plane view showing a sideboard in accordance with a second embodiment of the present invention, and FIG. 3D is a plane view showing a connector in accordance with a second embodiment of the present invention, in which the same components are denoted by the same reference numerals as in the first embodiment. The second embodiment is different from the first embodiment in that the slots or holes 24 with the different number are formed in the sideboard 22 of the frame body 21. Four slots 24 are formed in the sideboard 22 of the frame body 21 around the receiving hole 23 at equal intervals, wherein a shape of the slot 24 can be arcuate as shown in FIG. 3C. The connector 30 has a central protrusion 34 and four peripheral protrusions 33 formed on the end face of the main body section 31 corresponding to the slots 24, wherein a shape of the peripheral protrusions 33 can be arcuate as shown in FIG. 3D. The central protrusion 34 and peripheral protrusions 33 are integral with the connector 30. The four protrusions 42 are assembled in the four slots 41 to securely connect the connector 30 with the frame body 21 by the riveting and/or soldering process as illustrated in FIGS. 2E-2G, wherein the connector 30 covers the receiving hole 23 and the slots 24. Also, the shielding device 20 of the present invention can have a torque value over 60 kg-cm.

Figure 3E:
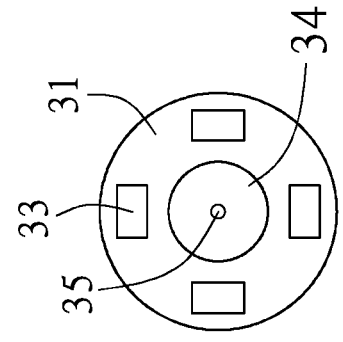
FIGS. 3E-3H are plane views showing peripheral protrusions of the connectors have various shapes in accordance with the second embodiment of the present invention.
Figure 3F:
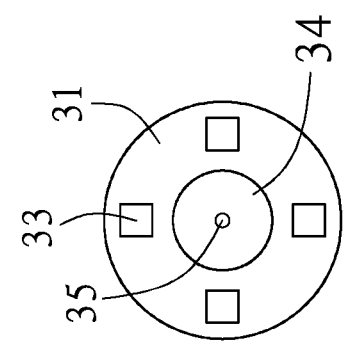
Figure 3G:
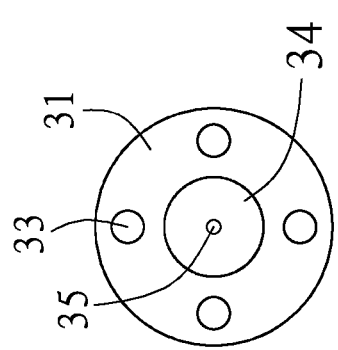
Figure 3H:
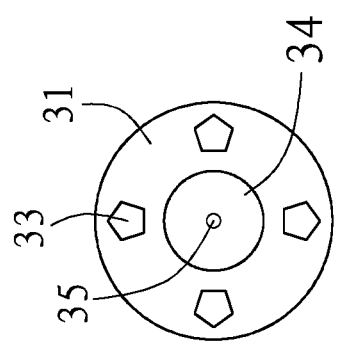

The slots 24 and the peripheral protrusions 33 may have a corresponding shape or the same shape. For example, referring to FIGS. 3C and 3D, the four slots 24 and four peripheral protrusions 33 have an arcuate shape. Alternatively, the four peripheral protrusions 33 may have a circular shape, as seen in FIG. 3E, and the four slots 24 can be replaced with four circular holes for receiving the four circular peripheral protrusions 33 respectively such that the four circular peripheral protrusions 33 can be riveted and/or soldered to the four circular holes, as mentioned above. Alternatively, the four peripheral protrusions 33 may have a square shape, as seen in FIG. 3F, and the four slots 24 can be replaced with four square holes for receiving the four square peripheral protrusions 33 respectively such that the four square peripheral protrusions 33 can be riveted and/or soldered to the four square holes, as mentioned above. Alternatively, the four peripheral protrusions 33 may have a rectangular shape, as seen in FIG. 3G, and the four slots 24 can be replaced with four rectangular holes for receiving the four rectangular peripheral protrusions 33 respectively such that the four rectangular peripheral protrusions 33 can be riveted and/or soldered to the four rectangular holes, as mentioned above. Alternatively, the four peripheral protrusions 33 may have a polygon shape, such as pentagon shape, as seen in FIG. 3H, and the four slots 24 can be replaced with four polygon holes, such as pentagon holes, for receiving the four polygon peripheral protrusions 33 respectively such that the four polygon peripheral protrusions 33 can be riveted and/or soldered to the four polygon holes, as mentioned above. In the second embodiment, two of the four peripheral protrusions 33 are arranged at opposite top and bottom sides with respect to the central protrusion 34, and the other two of the four peripheral protrusions 33 are arranged at opposite left and right sides with respect to the central protrusion 34. Two of the four slots or holes 24 are arranged at opposite top and bottom sides with respect to the receiving hole 23, and the other two of the four slots or holes 24 are arranged at opposite left and right sides with respect to the receiving hole 23.

Alternatively, some of the peripheral protrusions 33 may have a shape different from the other some of the peripheral protrusions 33, and some of the slots or holes 24 may have a shape different from the other some of the slots or holes 24. For example, two of the four peripheral protrusions 33 may have an arcuate shape at opposite top and bottom sides with respect to the central protrusion 34, and the other two of the four peripheral protrusions 33 may have a circular shape at opposite left and right sides with respect to the central protrusion 34. In correspondence with the peripheral protrusions 33, two of the four slots or holes 24 may have an arcuate shape for receiving the arcuate two of the peripheral protrusions 33 respectively and the other two of the four slots or holes 24 may have a circular shape for receiving the circular two of the peripheral protrusions 33 respectively. With respect to the above protrusions and slots or holes in the second embodiment, the slots or holes 24 are arranged at a first circular ring having the same center as that of the receiving hole 23 and the peripheral protrusions 33 are arranged at a second circular ring having the same center as that of the central protrusion 34, wherein the first circular ring has the same diameter as the second circular ring. A first distance in a radial direction is between each of the slots or holes 24 and the receiving hole 23 and the first distances between the slots or holes 24 and the receiving hole 23 can be substantially the same. A second distance in an arcuate direction along the first circular ring is between each neighboring two of the slots or holes 24 and the second distances between the neighboring two of the slots or holes 24 can be substantially the same. A first gap in a radial direction is between each of the peripheral protrusions 33 and the central protrusion 34 and the first gaps between the peripheral protrusions 33 and the central protrusion 34 can be substantially the same. A second gap in an arcuate direction along the second circular ring is between each neighboring two of the peripheral protrusions 33 and the second gaps between the neighboring two of the peripheral protrusions 33 can be substantially the same.

Figure 4A:
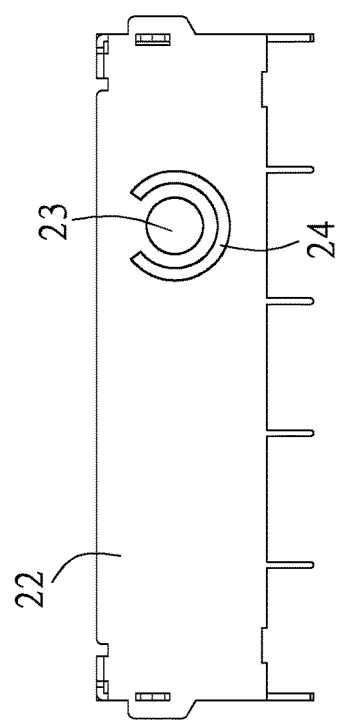
FIG. 4A is a plane view showing a sideboard in accordance with a third embodiment of the present invention.
Figure 4B:
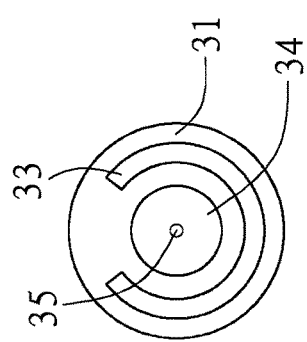
FIGS. 4B and 4C are plane views showing connectors have peripheral protrusions with various shapes in accordance with a third embodiment of the present invention.
Figure 4C:
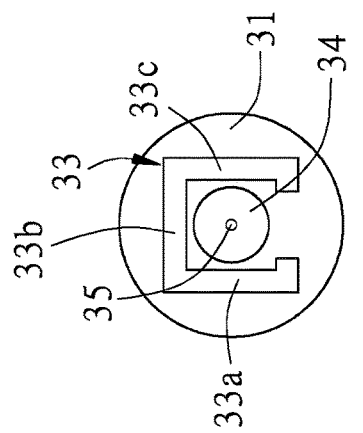

FIG. 4A is a plane view showing a sideboard in accordance with a third embodiment of the present invention and FIG. 4B is a plane view showing a connector in accordance with a third embodiment of the present invention. The third embodiment is different from the above embodiments in that the slots or holes 24 with the different number are formed in the sideboard 22 of the frame body 21. Only one slot 24 is formed in the sideboard 22 of the frame body 21 around the receiving hole 23, wherein the slot 24 may be shaped like an arc of greater than 130 degrees, 180 degrees, 225 degrees or 270 degrees with respect to a center of the receiving hole 23, for example. The connector 30 has a central protrusion 34 and only one peripheral protrusion 33 formed on the end face of the main body section 31 corresponding to the slot 24, wherein the peripheral protrusion 33 may be shaped like an arc of greater than 130 degrees, 180 degrees, 225 degrees or 270 degrees with respect to a center of the central protrusion 34, for example, as shown in FIG. 4B, which is the same as the arc of the slot 24 with respect to a center of the receiving hole 23. The central protrusion 34 and peripheral protrusion 33 may be integral with the connector 30. The slot 24 is arranged at a first circular ring having the same center as that of the receiving hole 23 and the peripheral protrusion 33 is arranged at a second circular ring having the same center as that of the central protrusion 34, wherein the first circular ring has the same diameter as the second circular ring. The peripheral protrusion 33 is assembled in the slot 24 to securely connect the connector 30 with the frame body 21 by the riveting and/or soldering process as illustrated in FIGS. 2E-2G, wherein the connector 30 covers the receiving hole 23 and slot 24. Also, the shielding device of the present invention can have a torque value over 60 kg-cm. The slot 24 and the peripheral protrusion 33 have a corresponding shape or the same shape. Alternatively, the peripheral protrusion 33 may have a square or rectangular shape, as seen in FIG. 4C, and the slot 24 can have a square or rectangular shape for receiving the peripheral protrusion 33 such that the peripheral protrusion 33 can be riveted and/or soldered to the slot 24, as mentioned above. A minimum gap between a longitudinal side bar 33b of the peripheral protrusion 33 and the central protrusion 34 and be substantially the same as another minimum gap between another longitudinal side bar 33c of the peripheral protrusion 33 and the central protrusion 34.

Figure 5B:
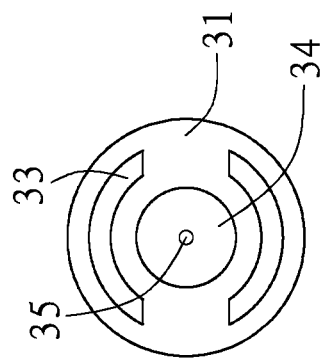
Figure 5A:
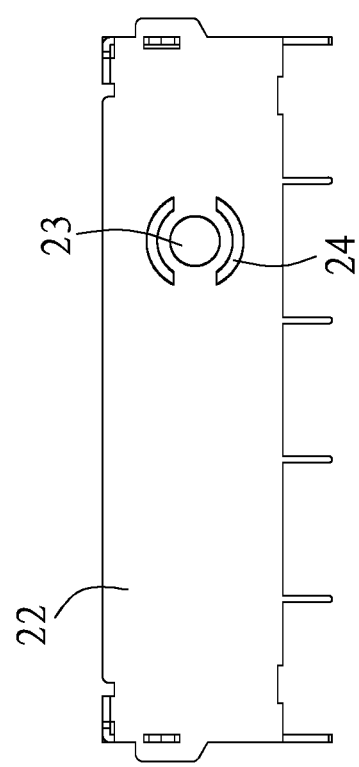
FIG. 5A is a plane view showing a sideboard in accordance with a fourth embodiment of the present invention.

FIG. 5A is a plane view showing a sideboard in accordance with a fourth embodiment of the present invention and FIG. 5B is a plane view showing a connector in accordance with a third embodiment of the present invention. The fourth embodiment is different from the above embodiments in that the slots or holes with the different number are formed in the sideboard 22 of the frame body 21. Two slots 24 are formed in the sideboard 22 of the frame body 21 around the receiving hole 23 at equal intervals, wherein a shape of the slots 24 can be arcuate. The connector 30 has a central protrusion 34 and two peripheral protrusions 33 formed on the end face of the main body section 31 corresponding to the slots 24, wherein a shape of the peripheral protrusions 33 can be arcuate as shown in FIG. 5B. The central protrusion 34 and peripheral protrusions 33 may be integral with the connector 30. The peripheral protrusions 33 are assembled in the respective slots 24 to securely connect the connector 30 with the frame body 21 by the riveting and/or soldering process as illustrated in FIGS. 2E-2G, wherein the connector 30 covers the receiving hole 23 and slots 24. Also, the shielding device of the present invention can have a torque value over 60 kg-cm.

The slots 24 and the peripheral protrusions 33 may have a corresponding shape or the same shape. For example, referring to FIGS. 5A and 5B, the two slots 24 and two peripheral protrusions 33 have an arcuate shape. Alternatively, the two peripheral protrusions 33 may have a circular shape, as seen in FIG. 5C, and the two slots 24 can be replaced with two circular holes for receiving the two circular peripheral protrusions 33 respectively such that the two circular peripheral protrusions 33 can be riveted and/or soldered to the two circular holes, as mentioned above. Alternatively, the two peripheral protrusions 33 may have a square shape, as seen in FIG. 5D, and the two slots 24 can be replaced with two square holes for receiving the two square peripheral protrusions 33 respectively such that the two square peripheral protrusions 33 can be riveted and/or soldered to the two square holes, as mentioned above. Alternatively, the two peripheral protrusions 33 may have a rectangular shape, as seen in FIG. 5E, and the two slots 24 can be replaced with two rectangular holes for receiving the two rectangular peripheral protrusions 33 respectively such that the two rectangular peripheral protrusions 33 can be riveted and/or soldered to the two rectangular holes, as mentioned above. Alternatively, the two peripheral protrusions 33 may have a polygon shape, such as pentagon shape, as seen in FIG. 5F, and the two slots 24 can be replaced with two polygon holes, such as pentagon holes, for receiving the two polygon peripheral protrusions 33 respectively such that the two polygon peripheral protrusions 33 can be riveted and/or soldered to the two polygon holes, as mentioned above. Alternatively, one of the peripheral protrusions 33 may have a shape different from the other one of the peripheral protrusions 33, and one of the slots or holes 24 may have a shape different from the other one of the slots or holes 24. For example, one of the peripheral protrusions 33 may have an arcuate shape and the other one of the peripheral protrusions 33 may have a circular shape opposite to the arcuate one of the peripheral protrusions 33. In correspondence with the peripheral protrusions 33, one of the slots or holes 24 may have an arcuate shape for receiving the arcuate one of the peripheral protrusions 33 and the other one of the slots or holes 24 may have a circular shape for receiving the circular one of the peripheral protrusions 33. With respect to the above peripheral protrusions and slots or holes in the fourth embodiment, the slots or holes 24 are arranged opposite to each other with respect to the receiving hole 23 and the peripheral protrusions 33 are arranged opposite to each other with respect to the central protrusion 34. A distance in a radial direction is between each of the slots or holes 24 and the receiving hole 23 and the distances between the slots or holes 24 and the receiving hole 23 can be substantially the same. A gap in a radial direction is between each of the peripheral protrusions 33 and the central protrusion 34 and the gaps between the peripheral protrusions 33 and the central protrusion 34 can be substantially the same.

Alternatively, the peripheral protrusions may have the various number, such as five, six, seven, eight and so on, and various shapes.

In conclusion, the shielding device of the present invention meets the requirement for high torque specification without any additional reinforcing measure.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A shielding device, comprising:
   a frame body comprising multiple sideboards standing at multiple sides of said frame body, wherein a first hole in one of said sideboards and a second hole in said one of said sideboards, wherein an accommodating space in said frame body and surrounded by said sideboards is configured to accommodate a circuit board; and
   a connector fixed with said frame body, wherein said connector comprises a first protrusion protruding from a planar surface of said connector and passing through said first hole and a second protrusion protruding from said planar surface of said connector and passing through said second hole, wherein said first and second protrusions are integral with a main body of said connector as a single part, and wherein said connector comprises a round cylinder with an outer thread, wherein a radial gap is between said first and second protrusions and is over said planar surface, wherein a longitudinal axis of said connector passes through said first protrusion, wherein said second protrusion comprises a head in said accommodating space, wherein said head of said second protrusion has a transverse dimension greater than that of a center portion of said second protrusion in said second hole.

2. The shielding device of claim 1, wherein said second protrusion has an arcuate shape.

3. The shielding device of claim 1, wherein said second protrusion has a circular shape.

4. The shielding device of claim 1, wherein said first protrusion has a perfectly circular shape with a center at said longitudinal axis of said connector.

5. The shielding device of claim 1, wherein said second protrusion has a square shape.

6. The shielding device of claim 1, wherein said second protrusion has a rectangular shape.

7. The shielding device of claim 1, wherein said second protrusion has a pentagon shape.

8. The shielding device of claim 1, wherein said first protrusion has a perfectly circular shape and said second protrusion has an arcuate shape with a radian greater than 130 degrees with respect to a center of said first protrusion.

9. The shielding device of claim 1, wherein said second protrusion comprises a first bar extending in a first direction and a second bar extending in a second direction different from said first direction, wherein said first and second bars join together with each other over said planar surface of said connector.

10. The shielding device of claim 1, wherein said connector further comprises a third protrusion protruding from said planar surface of said connector and passing through a third hole in said one of said sideboards, wherein said third protrusion is opposite to said second protrusion with respect to said first protrusion.

11. The shielding device of claim 10, wherein said third protrusion has a different shape from said second protrusion.

12. The shielding device of claim 1, wherein said second protrusion comprises a first arcuate sidewall and a second arcuate sidewall opposite to said first arcuate sidewall, wherein a radial gap between said first arcuate sidewall and a sidewall of said round cylinder and over said planar surface has a distance smaller than that of a radial gap between said second arcuate sidewall and a sidewall of said first protrusion and over said planar surface.

13. The shielding device of claim 1 further comprising a solder joint joining said second protrusion and said one of said sideboards.

14. The shielding device of claim 1, wherein a third hole passing through said first protrusion is configured to receive a wire.

15. The shielding device of claim 14, wherein said wire comprises a copper wire.

16. The shielding device of claim 1, wherein said connector further comprises a third protrusion protruding from said planar surface of said connector and passing through a third hole in said one of said sideboards and a fourth protrusion protruding from said planar surface of said connector and passing through a fourth hole in said one of said sideboards, wherein said second, third and fourth protrusions surrounds said first protrusion, wherein said second, third and fourth holes surrounds said first hole.

17. The shielding device of claim 16, wherein said second, third and fourth protrusions extend in respective arcs on the circumference of a circle.

18. The shielding device of claim 1, wherein said connector further comprises a third protrusion protruding from said planar surface of said connector and passing through a third hole in said one of said sideboards, a fourth protrusion protruding from said planar surface of said connector and passing through a fourth hole in said one of said sideboards and a fifth protrusion protruding from said planar surface of said connector and passing through a fifth hole in said one of said sideboards, wherein said second, third, fourth and fifth protrusions surrounds said first protrusion, wherein said second protrusion is opposite to said fourth protrusion with respect to said first protrusion, wherein said third protrusion is opposite to said fifth protrusion with respect to said first protrusion, wherein said second, third, fourth and fifth holes surrounds said first hole, wherein said second hole is opposite to said fourth hole with respect to said first hole, wherein said third hole is opposite to said fifth hole with respect to said first hole.

19. The shielding device of claim 18, wherein said second, third, fourth and fifth protrusions extend in respective arcs on the circumference of a circle.

20. A connector configured to be fixed with a board, comprising a first protrusion protruding from a planar surface of said connector and a second protrusion protruding from said planar surface of said connector, wherein said first and second protrusions are integral with a main body of said connector as a single part, and wherein said connector comprises a round cylinder with an outer thread, wherein said second protrusion comprises a first arcuate sidewall and a second arcuate sidewall opposite to said first arcuate sidewall, wherein a radial gap between said first arcuate sidewall and a sidewall of said round cylinder and over said planar surface has a distance smaller than that of a radial gap between said second arcuate sidewall and a sidewall of said first protrusion and over said planar surface.

* * * * *